(12) United States Patent
Kim et al.

(10) Patent No.: US 11,688,661 B2
(45) Date of Patent: *Jun. 27, 2023

(54) SEMICONDUCTOR DEVICE AND METHOD OF MANUFACTURING THE SAME

(71) Applicant: SAMSUNG ELECTRONICS CO., LTD., Suwon-si (KR)

(72) Inventors: Suin Kim, Seoul (KR); Jiyong Kim, Suwon-si (KR); Sung-Ki Lee, Seoul (KR)

(73) Assignee: Samsung Electronics Co., Ltd., Suwon-si (KR)

(*) Notice: Subject to any disclaimer, the term of this patent is extended or adjusted under 35 U.S.C. 154(b) by 64 days.

This patent is subject to a terminal disclaimer.

(21) Appl. No.: 17/332,574

(22) Filed: May 27, 2021

(65) Prior Publication Data

US 2021/0287959 A1    Sep. 16, 2021

Related U.S. Application Data

(63) Continuation of application No. 16/534,057, filed on Aug. 7, 2019, now Pat. No. 11,056,416.

(30) Foreign Application Priority Data

Sep. 5, 2018   (KR) .................. 10-2018-0105844

(51) Int. Cl.
*H01L 23/367*  (2006.01)
*H05K 5/02*    (2006.01)
(Continued)

(52) U.S. Cl.
CPC ............ *H01L 23/3677* (2013.01); *G11C 5/04* (2013.01); *H01L 23/02* (2013.01); *H05K 5/0256* (2013.01)

(58) Field of Classification Search
CPC ... H01L 23/36; H01L 23/367; H01L 23/3677; H01L 23/34; H01L 23/02
See application file for complete search history.

(56) References Cited

U.S. PATENT DOCUMENTS

| 4,399,487 A | 8/1983 | Neumann |
| 4,599,680 A | 7/1986 | Gibson et al. |

(Continued)

FOREIGN PATENT DOCUMENTS

| JP | 2002298571 A | 10/2002 |
| JP | 4142417 B2 | 9/2008 |

(Continued)

OTHER PUBLICATIONS

Machine translation, Park, Korean Pat. Pub. No. KR100757481B1, translation date: Jan. 24, 2023, Espacenet, all pages. (Year: 2023).*

(Continued)

*Primary Examiner* — Victoria K. Hall
(74) *Attorney, Agent, or Firm* — Volentine, Whitt & Francos, PLLC

(57) ABSTRACT

A semiconductor device includes a first case part, a second case part coupled to the first case part to provide a case, a semiconductor module disposed within the case closer to the second case part than to the first case part, and a plate interposed between the first case part and the semiconductor module. The plate is a thermal conductor, that is a material having thermal conductivity, to transfer heat generated by the semiconductor module to the case where the heat can dissipate to the outside of the semiconductor device.

19 Claims, 11 Drawing Sheets

(51) Int. Cl.
  *G11C 5/04* (2006.01)
  *H01L 23/02* (2006.01)

(56) References Cited

U.S. PATENT DOCUMENTS

| | | | |
|---|---|---|---|
| 5,091,823 A | 2/1992 | Kanbara et al. | |
| 5,778,526 A | 7/1998 | Vinciarelli et al. | |
| 6,362,964 B1 | 3/2002 | Dubhashi et al. | |
| 6,407,965 B1 | 6/2002 | Matoge et al. | |
| 7,142,434 B2 | 11/2006 | Beihoff et al. | |
| 7,187,568 B2 | 3/2007 | Radosevich et al. | |
| 7,215,023 B2 | 5/2007 | Baeumel et al. | |
| 7,274,569 B2 | 9/2007 | Sonoda | |
| 7,830,689 B2 | 11/2010 | Nakamura et al. | |
| 7,965,510 B2 | 6/2011 | Suzuki et al. | |
| 8,240,411 B2 | 8/2012 | Nakatsu et al. | |
| 9,317,081 B2 | 4/2016 | Mundt et al. | |
| 9,720,462 B2 | 8/2017 | Merz et al. | |
| 9,807,899 B2 | 10/2017 | Matsuda et al. | |
| 9,866,127 B2 | 1/2018 | Fukumasu et al. | |
| 9,867,297 B2 | 1/2018 | Suzuki et al. | |
| 10,143,117 B2 | 11/2018 | Lin | |
| 10,678,311 B2 | 6/2020 | Kim et al. | |
| 10,834,857 B2 | 11/2020 | Lee et al. | |
| 10,955,882 B2 * | 3/2021 | Cinar | G06F 1/182 |
| 11,011,453 B2 * | 5/2021 | Arai | H01L 23/3677 |
| 11,056,416 B2 * | 7/2021 | Kim | H01L 23/02 |
| 11,061,449 B2 * | 7/2021 | Kim | G06F 1/20 |
| 11,317,540 B2 * | 4/2022 | Hur | H05K 1/0201 |
| 11,425,843 B2 * | 8/2022 | Yagi | H05K 7/20472 |
| 11,576,287 B2 * | 2/2023 | Lee | G06F 3/0679 |
| 2001/0014029 A1 | 8/2001 | Suzuki et al. | |
| 2002/0053421 A1 | 5/2002 | Hisano et al. | |
| 2003/0067749 A1 | 4/2003 | Tamba et al. | |
| 2006/0030173 A1 | 2/2006 | Kawakita et al. | |
| 2008/0049476 A1 | 2/2008 | Azuma et al. | |
| 2008/0158137 A1 | 7/2008 | Yoshida | |
| 2008/0284934 A1 | 11/2008 | Umezaki et al. | |
| 2009/0284913 A1 * | 11/2009 | Wakabayashi | H04L 65/70 361/679.54 |
| 2009/0322149 A1 | 12/2009 | Kishibata | |
| 2010/0025126 A1 | 2/2010 | Nakatsu et al. | |
| 2010/0208427 A1 | 8/2010 | Horiuchi et al. | |
| 2011/0188207 A1 | 8/2011 | Won et al. | |
| 2011/0249421 A1 | 10/2011 | Matsuo | |
| 2011/0310585 A1 | 12/2011 | Suwa et al. | |
| 2013/0021749 A1 | 1/2013 | Nakajima et al. | |
| 2013/0093948 A1 | 4/2013 | Takeshita | |
| 2013/0155800 A1 | 6/2013 | Shim et al. | |
| 2013/0228908 A1 | 9/2013 | Takahashi | |
| 2013/0235527 A1 | 9/2013 | Wagner | |
| 2014/0036435 A1 | 2/2014 | Kim | |
| 2014/0117528 A1 | 5/2014 | Byun et al. | |
| 2014/0198447 A1 | 7/2014 | Tian | |
| 2015/0131353 A1 | 5/2015 | Nakajima | |
| 2015/0138735 A1 | 5/2015 | Oh et al. | |
| 2015/0200603 A1 | 7/2015 | Nam et al. | |
| 2015/0214889 A1 | 7/2015 | Nam et al. | |
| 2016/0029511 A1 | 1/2016 | Jung et al. | |
| 2016/0086917 A1 | 3/2016 | Byun et al. | |
| 2016/0120039 A1 | 4/2016 | Bang et al. | |
| 2016/0261292 A1 * | 9/2016 | Ikuma | H01L 23/552 |
| 2016/0307818 A1 | 10/2016 | Kawase et al. | |
| 2017/0006703 A1 | 1/2017 | Haraguchi et al. | |
| 2017/0008554 A1 | 1/2017 | Hirotani | |
| 2017/0060195 A1 | 3/2017 | Kim | |
| 2017/0105314 A1 | 4/2017 | Kim et al. | |
| 2017/0188473 A1 * | 6/2017 | Suzuki | H05K 5/0043 |
| 2018/0007785 A1 | 1/2018 | Kamikura et al. | |
| 2018/0014426 A1 | 1/2018 | Kim | |
| 2018/0026381 A1 | 1/2018 | Haraguchi | |
| 2018/0034169 A1 | 2/2018 | Haraguchi | |
| 2018/0203496 A1 | 7/2018 | Campbell et al. | |
| 2018/0286778 A1 | 10/2018 | Spann | |
| 2018/0295755 A1 | 10/2018 | Lin | |
| 2018/0338021 A1 | 11/2018 | Hebert et al. | |
| 2018/0343737 A1 | 11/2018 | Morimoto et al. | |
| 2019/0075673 A1 | 3/2019 | Kogure | |
| 2019/0098777 A1 | 3/2019 | Nakatsu et al. | |
| 2019/0166691 A1 * | 5/2019 | Kim | H05K 7/20445 |
| 2019/0206810 A1 | 7/2019 | Kanai | |
| 2019/0212076 A1 | 7/2019 | Lan | |
| 2019/0354145 A1 | 11/2019 | Kim et al. | |
| 2020/0118902 A1 | 4/2020 | Neal et al. | |
| 2020/0120830 A1 | 4/2020 | Song | |
| 2020/0077547 A1 | 5/2020 | Lee et al. | |
| 2020/0158295 A1 | 5/2020 | Li et al. | |
| 2020/0235025 A1 | 7/2020 | Shimizu | |
| 2020/0352056 A1 * | 11/2020 | Yoshida | H05K 7/20409 |
| 2020/0388556 A1 | 12/2020 | Tsuyuno | |
| 2021/0092871 A1 * | 3/2021 | Hur | H05K 7/20145 |
| 2021/0321539 A1 * | 10/2021 | Teranishi | H05K 7/20409 |
| 2022/0132701 A1 * | 4/2022 | Lee | G06F 1/181 |

FOREIGN PATENT DOCUMENTS

| | | | |
|---|---|---|---|
| JP | WO-2014021046 A1 | 7/2016 | |
| KR | 2002-0088973 | * 11/2002 | F24F 1/0057 |
| KR | 2018-0016844 A | 11/2002 | |
| KR | 1020070087788 A | 8/2007 | |
| KR | 10-2018-0016844 | * 2/2018 | H05K 1/02 |
| KR | 2002-0088973 A | 2/2018 | |

OTHER PUBLICATIONS

Machine translation, Request for the Submission of an Opinion, KIPO, dated Nov. 21, 2022, Google translation date: Jan. 24, 2023, all pages. (Year: 2023).*

Korean Examination Report dated Nov. 21, 2022 Cited in Corresponding Korean Application.

* cited by examiner

SEMICONDUCTOR DEVICE AND METHOD OF MANUFACTURING THE SAME

PRIORITY STATEMENT

This is a Continuation of U.S. application Ser. No. 16/534,057, filed Aug. 7, 2019, now U.S. Pat. No. 11,056,416 issued on Jul. 6, 2021, and a claim of priority under 35 U.S.C. § 119 is made to Korean Patent Application No. 10-2018-0105844, filed on Sep. 5, 2018, in the Korean Intellectual Property Office, the disclosures of which are hereby incorporated by reference in their entireties.

BACKGROUND

The inventive concepts relate to a semiconductor device and, more particularly, to an SSD memory device.

A solid state drive (or solid state disk; SSD) stores data using a memory device such as a flash memory and may thus serve as a substitute for a typical hard disk drive (HDD). The term "solid state" refers to the fact that an SSD does not have mechanically moving parts, as compared to a typical HDD. Thus, an SSD may operate with less seek time, latency, and mechanical driving time than an HDD and thus may operate at a relatively high speed. In addition, the SSD is not prone to errors caused by mechanical friction and thus may have better reliability than an HDD.

Typically, an SSD includes a package in which memory chips are mounted on a printed circuit board (PCB), and such an SSD package may be provided in a closed case or an opened case.

SUMMARY

According to an aspect of the inventive concept, there is provided a semiconductor device including a first case part, a second case part coupled to the first case part and collectively providing a case, a semiconductor module disposed within the case and situated closer to the second case part than to the first case part, and a thermal conductor comprising a plate disposed within the case and interposed between the first case part and the semiconductor module. The plate transfers heat generated by the semiconductor module to the first case part.

According to another aspect of the inventive concept, there is provided a semiconductor device including a case, a semiconductor module disposed within the case, a thermal conductor comprising a plate disposed within the case, and thermal interface material interposed between and thermally coupling the semiconductor module and the plate of the thermal conductor. The case includes a bottom part and a top part coupled to the bottom part, the bottom part including a bottom wall of the case and the top part including a top wall of the case spaced from and disposed opposite the bottom wall. The semiconductor module has a package substrate situated closer to the top wall of the case than to the bottom wall of the case, and electronic components mounted and electrically connected to the package substrate. At least one of the electronic components comprises a semiconductor chip. The thermal conductor is interposed between the bottom wall of the case and the semiconductor module whereby one side of the plate faces the semiconductor module and another side of the plate faces the bottom wall of the case. The thermal conductor is thermally conductively coupled to the bottom part of the case in a region between the plate and the bottom wall of the case. Thus, heat generated by the semiconductor module is transferred to the plate by the thermal interface material and then to the case by the thermal conductor so as to dissipate to the outside of the case.

According to another aspect of the inventive concept, there is provided a semiconductor device including a case, a semiconductor module disposed within the case, a thermally conductive plate disposed within the case, and thermal interface material thermally coupling the semiconductor module and the thermally conductive plate. The case includes a bottom part and a top part coupled to the bottom part, the bottom part including a bottom wall of the case and the top part including a top wall of the case spaced from and disposed opposite the bottom wall. The semiconductor module has a package substrate and electronic components mounted and electrically connected to the package substrate. A least one of the electronic components comprises a semiconductor chip. The thermally conductive plate has a top surface facing the semiconductor module and a bottom surface facing the bottom wall of the case. The thermal interface material is disposed on only a portion of the top surface of the thermally conductive plate at a region vertically juxtaposed with at least one of the electronic components of the semiconductor module. Heat generated by the semiconductor module is transferred to the thermally conductive plate by the thermal interface material and then to the case so as to dissipate to the outside of the case.

According to another aspect of the inventive concept, there is provided a method of manufacturing a semiconductor device, including providing a semiconductor module, providing a plate, which overlaps with the semiconductor module and includes a material having thermal conductivity, on the semiconductor module, providing first and second case parts which are coupled to each other to form an inner space in which the semiconductor module and the plate are disposed, and coupling the first case part, the semiconductor module, the plate, and the second case part to manufacture a semiconductor device. The plate may conduct heat generated from the semiconductor module to dissipate the heat to an outside of the semiconductor device.

BRIEF DESCRIPTION OF THE DRAWINGS

The inventive concepts will become more apparent in view of the attached drawings and accompanying detailed description.

DETAILED DESCRIPTION

Figure 1A:
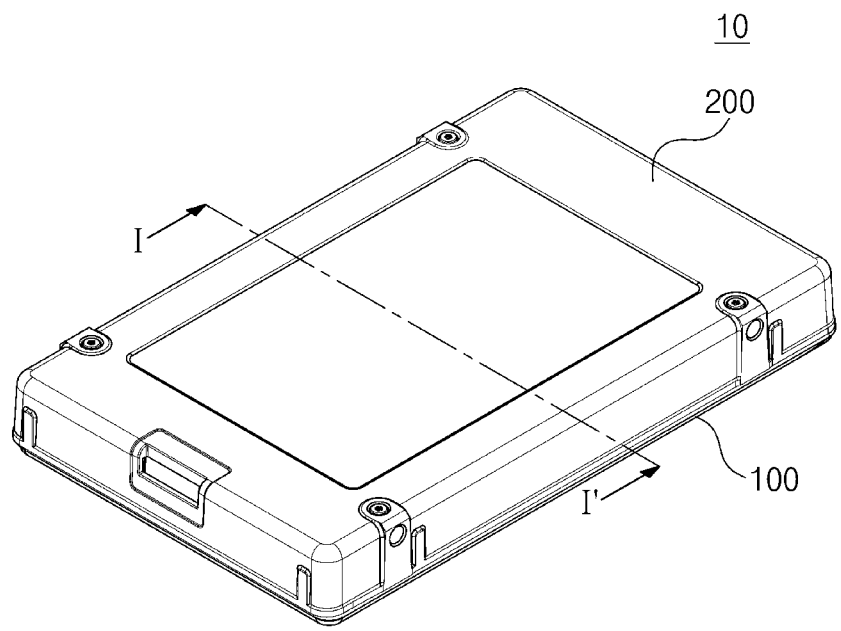
FIG. 1A is a perspective view of an example of a semiconductor device according to the inventive concepts.

Examples of semiconductor devices, and in particular, SSDs, according to the present inventive concepts will now be described in detail with reference to the drawings. In the drawings, the sizes and/or ratios of some components or elements may be exaggerated or reduced, or otherwise illustrated schematically, for clarity. Also, like reference numerals designate like elements throughout the drawings and therefore, an element or feature designated by a particular reference number and described in detail with reference to an example of the inventive concept may not be described again in detail in connection with other examples of the inventive concept.

One example of semiconductor device 10 according to the inventive concepts will first be described in detail with reference to FIGS. 1A, 1B, 2A and 2B and 3.

The semiconductor device 10 may include a first case part 100, a second case part 200, a semiconductor module 300, a plate 400, heat-absorbent material constituting a first heat dissipation member 500, and a connector 600. The semiconductor device 10 may be a memory device. For example, the semiconductor device 10 may be a solid state drive (or solid state disk; SSD).

The first case part 100 and the second case part 200 may be coupled to each other to form a case having an inner space 105. Each of the first and second case parts 100 and 200 may include a bottom surface and four sidewalls vertically protruding from edges of the bottom surface. However, the inventive concepts are not limited thereto. For example, the first case part 100 may be a lower part of the case in the form of a tray and the second case part 200 may be an upper part of the case and serve as a cover of the case. Heights of the sidewalls of the first case part 100 are less than heights of the sidewalls of the second case part 200 in the example of FIGS. 1A, 1B, 2A and 2B. However, the inventive concepts are not limited thereto.

The first case part 100 may include a first coupling part 102. The first coupling part 102 helps couple the first case part 100 to the plate 400, the semiconductor module 300, and the second case part 200. For example, the first coupling part 102 is a boss having a female (internal) thread that can receive a screw. That is, the first coupling part 102 may be a tapped part of the first case part 100. The first case part 100 may be a metal case. For example, the first case part 100 may be formed of aluminum.

The second case part 200 may include a second coupling part 202. The second coupling part 202 may be provided at a position corresponding to the first coupling part 102. The second coupling part 202 also helps couple the second case part 200 to the plate 400, the semiconductor module 300, and the first case part 100. For example, the second coupling part 202 is an untapped boss defining therein a hole that can receive a screw. Thus, for example, when the first case part 100 and the second case part 200 are coupled to each other, the second coupling part 202 inserted in or against the first coupling part 102 and a screw SC may be inserted into the first and second coupling parts 102 and 202, and screwed to the first coupling part 102, to couple the first and second case parts 100 and 200 to each other.

That is, the screw and first and second coupling parts 102 and 202 may collectively constitute a coupling that couples the first and second case parts 100 and 200 to each other. As shown in the figures, four such sets of coupling parts 102 and 202 and screws SC are provided to form the coupling but the inventive concepts are not limited thereto. Moreover, the coupling parts 102 and 202 may have other configurations with respect to the manner in which the screw SC is received thereby. Still further, the coupling may take forms other than the above-described screw coupling.

The second case part 200 may also be a metal case. The second case part 200 may be formed of the same material as the first case part 100. For example, the second case part 200 may be formed of aluminum.

The semiconductor module 300 is provided between the first case part 100 and the second case part 200 of this example. That is, the semiconductor module 300 is disposed in the inner space 105. The semiconductor module 300 may be closer to the second case part 200 than to the first case part 100. More specifically, the semiconductor module 300 may be closer to the bottom surface of the second case part 200 than to the bottom surface of the first case part 100. The semiconductor module 300 can be electrically connected to an external device (not shown) through a connector C of FIG. 2B, and thus a position of the semiconductor module 300 may be determined by the connector C in the semiconductor device 10.

The semiconductor module 300 may be a single memory package. For example, the semiconductor module 300 may be an SSD package.

Figure 1B:
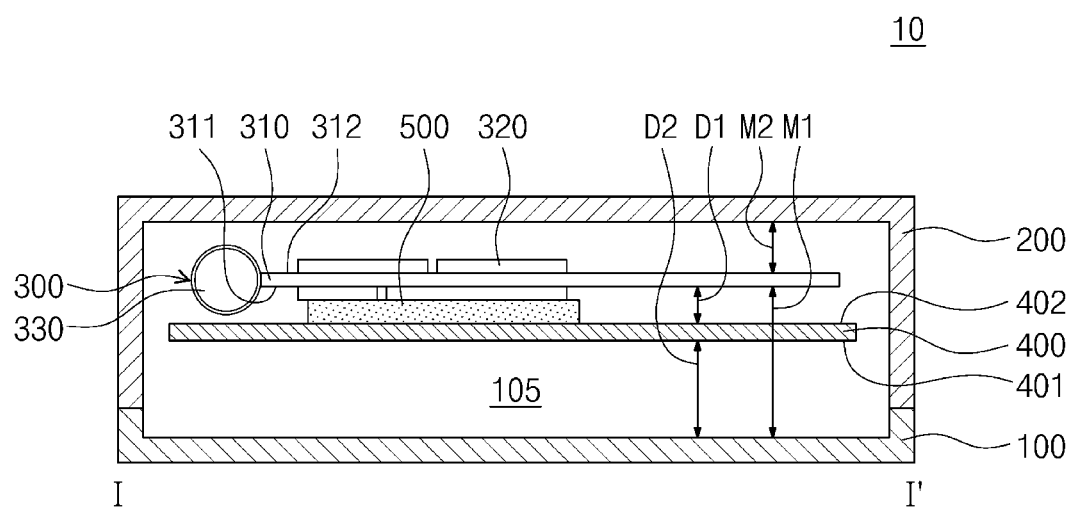
FIG. 1B is a cross-sectional view taken along a line I-I' of FIG. 1A.

The semiconductor module 300 may include a package substrate 310, a first semiconductor component 320, and a second semiconductor component 330. The package substrate 310 has an insulating body (body of at least one insulating or dielectric layer) and wiring (conductive pads, traces, vias or the like) integral with the insulating body. For example, the package substrate 310 is a printed circuit board (PCB). The package substrate 310 has a first surface 311 and a second surface 312. As shown in FIG. 1B, the first surface 311 of the package substrate 310 faces the bottom surface of the first case part 100 and/or the plate 400, and the second surface 312 of the package substrate 310 faces the bottom surface of the second case part 200.

The first semiconductor component 320 may includes at least one semiconductor chip electrically connected to the package substrate 310. The first semiconductor component 320 may have constituents, e.g., chips, disposed on the first and second surfaces 311 and 312, respectively. Alternatively, the first semiconductor component 320 may be provided on only one of the first and second surfaces 311 and 312. The first semiconductor component 320 may be a memory device. For example, the first semiconductor component 320 may include a memory chip and a logic chip. The first semiconductor component 320 may have a height H1. As used herein, the height of a semiconductor component refers to the maximum distance that the component protrudes vertically from the surface (first surface 311 or second surface 312) of the package substrate 310 on which the component is mounted. Constituents, e.g., chips, of the first semiconductor component 320 may have slightly different heights based on their type. However, particulars of an example in which chips of different heights are mounted to the package substrate 310 will be described later on.

The second semiconductor component 330 includes at least one semiconductor chip electrically connected to the package substrate 310. The second semiconductor component 330 may be disposed at a side of the package substrate 310. The second semiconductor component 330 may comprise a passive component. For example, the second semiconductor component 330 comprises a capacitor. The second semiconductor component 330 may have a height H2. The height H2 of the second semiconductor component 330 may be greater than the height H1 of the first semiconductor component 320.

Figure 2A:
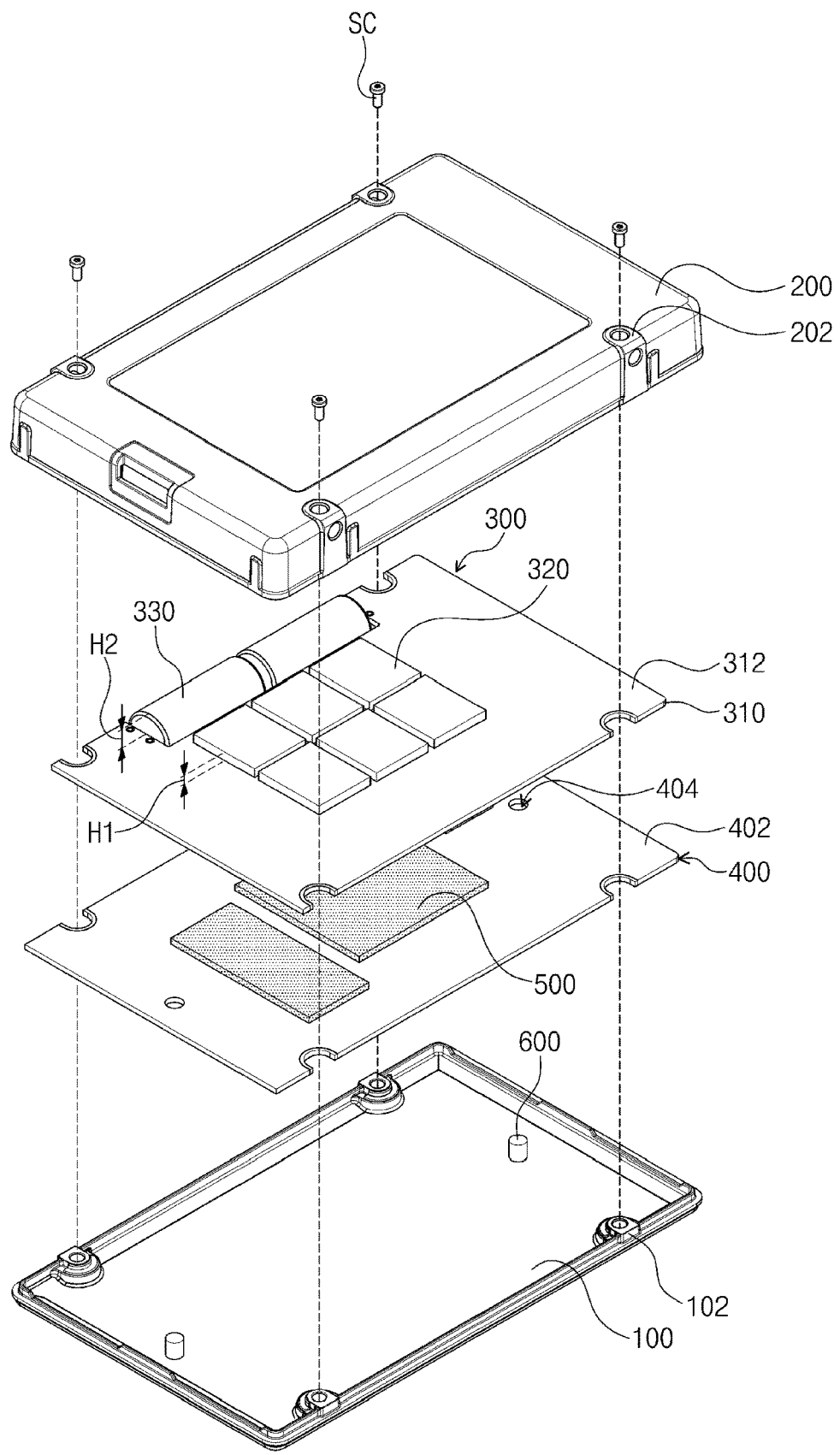
FIG. 2A is an exploded perspective view from the top of the semiconductor device of FIG. 1A.
Figure 2B:
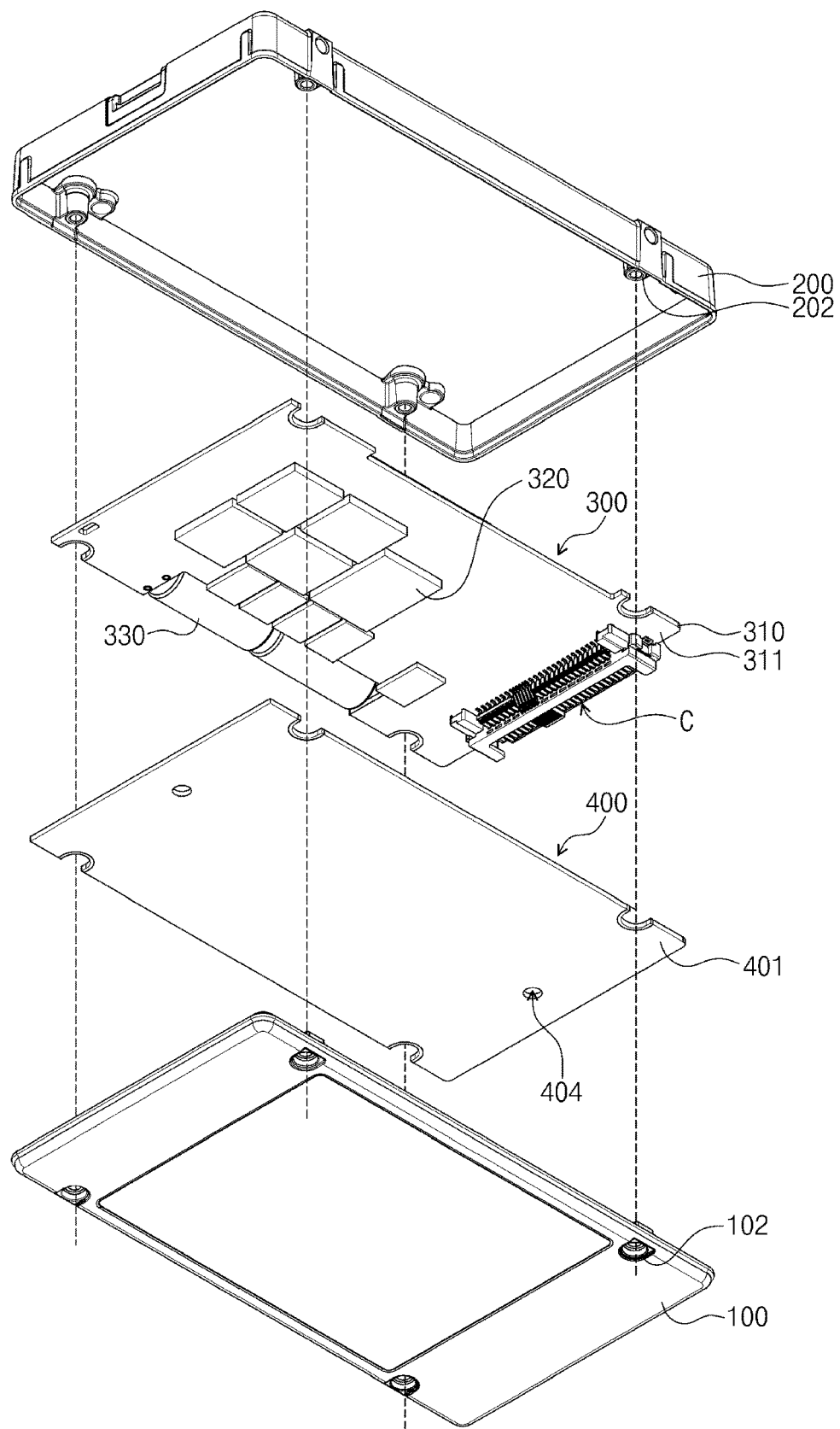
FIG. 2B is an exploded perspective view from the bottom of the semiconductor device of FIG. 1A.

The numbers, sizes and arrangement of the first and second semiconductor components 320 and 330 of the semiconductor device 10 as shown in and described with reference to FIGS. 1B, 2A and 2B are exemplary only. That is, the inventive concepts are not limited thereto.

The semiconductor module 300 is spaced apart from the first case part 100 by a first distance M1 and is spaced apart from the second case part 200 by a second distance M2 less than the first distance M1. In other words, the semiconductor module 300 may be closer to the second case part 200 than to the first case part 100. The plate 400 may be disposed between the first case part 100 and the semiconductor module 300. The second case part 200 may be adjacent to the semiconductor module 300. Thus, in this example the plate 400 is not interposed between the second case part 200 and the semiconductor module 300; rather, the plate 400 is disposed in the inner space 105 between the first case part 100 and the semiconductor module 300. A distance D1 between the plate 400 and the semiconductor module 300 may be less than a distance D2 between the plate 400 and the first case part 100. The plate 400 has a first surface 401 and a second surface 402. Referring to FIG. 1B, the first surface 401 of the plate 400 faces the bottom surface of the first case part 100, and the second surface 402 of the plate 400 faces the semiconductor module 300.

The first surface 401 and the second surface 402 of the plate 400 may be flat. Referring to FIGS. 2A and 2B, the plate 400 may have a hole(s) 404 extending therethrough between the first surface 401 and the second surface 402. The hole 404 may be formed at a position corresponding to the connector 600 on the bottom surface of the first case part 100. The connector 600 may be inserted in the hole 404 with an interference fit between the connector 600 and the plate 400. That is, a width or diameter of the connector 600 may be greater than the width or diameter of the hole 404. Thus, the plate 400 may be coupled to the first case part 100. In the example illustrated in FIGS. 2A and 2B, two holes 404 are formed at opposite ends of the plate 400, respectively, in correspondence with two connectors 600. However, the number, shape and/or position of the hole(s) 404 and corresponding connectors 600 are not limited thereto.

The plate 400 is of material that has a high thermal conductivity. The plate 400 may also be rigid. That is, a semiconductor device according to the inventive concept may have a thermal conductor in the form of a rigid plate, namely, the plate 400 is of thermally conductive material. To this end, the plate 400 may be a metal plate. The plate 400 may include the same material as the first case part 100 and the second case part 200. That is, the plate 400 may be but is not limited to being formed of aluminum. The plate 400 has a top surface facing the semiconductor module 300 and a bottom surface facing the bottom surface of the first case part 100. In the present specification, spatially relative terms such as "top" and "bottom" obviously refer to the positions of features when the semiconductor device is oriented as shown in the drawings.

When the semiconductor device 10 is operated, the plate 400 assists in dissipating or releasing heat emitted from the semiconductor module 300 to the outside of the semiconductor device 10. In particular, the plate 400 transfers heat generated from the first semiconductor component 320 disposed on the first surface 311 of the package substrate 310 to the outside of the semiconductor device 10. To this end, the plate 400 may be connected to the first case part 100 through the connector 600.

Referring to FIG. 1B, in this example the plate 400 is vertically juxtaposed with at least a portion of the semiconductor module 300. In this example, the plate 400 overlaps the semiconductor module 300 at both of its ends when viewed in a plan view. Accordingly, the degree of freedom of arranging and/or interconnecting the first and second semiconductor components 320 and 330 in the semiconductor module 300 is relatively high.

The first heat dissipation member 500 is interposed between the semiconductor module 300 and the plate 400. The first heat dissipation member 500 may be in contact with the semiconductor module 300 and the plate 400. Alternatively, the first heat dissipation member 500 may be in contact with only one of the semiconductor module 300 and the plate 400.

Figure 3:
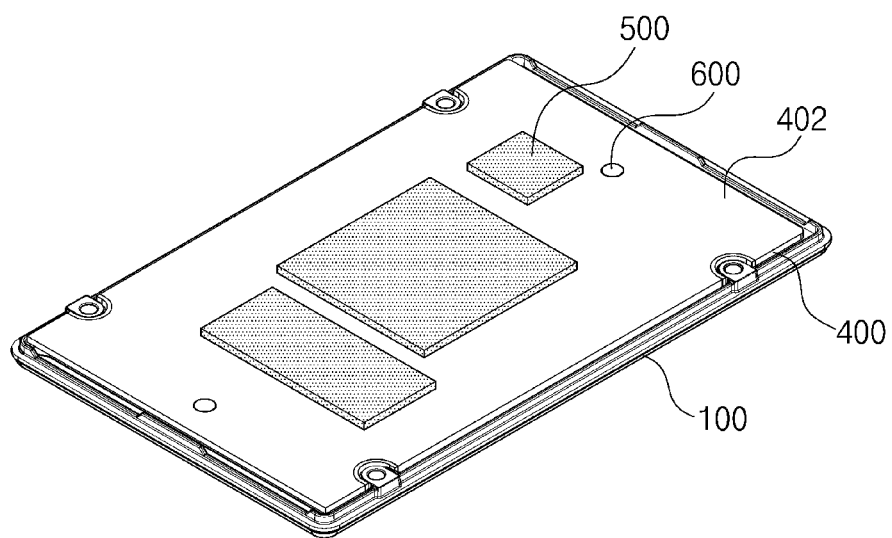
FIG. 3 is a perspective view of a first case part and a plate coupled to each other, of the semiconductor device of FIG. 1A.

Referring to FIGS. 2A, 2B and 3, the first heat dissipation member 500 may be disposed on the second surface 402 of the plate 400 at a position corresponding to the position of the first semiconductor component 320 disposed on the first surface 311 of the package substrate 310. The heat-absorbent material constituting the first heat dissipation member 500 may be a thermal interface material (TIM). For example, the heat-absorbent material constituting the first heat dissipation member 500 may be a piece(s) of thermal tape. The heat generated from the semiconductor module 300 may be effectively transferred to the plate 400 by the first heat dissipation member 500.

As was mentioned above, the connector 600 couples the first case part 100 and the plate 400. The connector 600 includes material that is thermally conductive. The connector 600 may be of the same material as the plate 400. For example, the connector 600 may be formed of aluminum. In the illustrated example, the connector 600 is inserted in the hole 404 with an interference fit such that the first case part 100 is press-fit to the plate 400. Alternatively, the connector 600 and the hole 404 may define a tapped opening that receives a screw such that the first case part 100 and the plate 400 are connected by the screw, or the connector 600 may be received in the hole 404 and welded to a portion of the plate 400 defining the hole 404 such that the first case part 100 and the plate 400 are connected by a weld. In addition, in the illustrated example the connector 600 is provided on the bottom surface of the first case part 100. Alternatively, the connector 600 may be provided at the plate 400.

As mentioned above, the first heat dissipation member 500 may comprise TIM. However, typical TIM used in applications such as those to which the inventive concepts pertain is relatively expensive. According to an aspect of the inventive concepts, the plate 400 allows for a minimal amount of heat transfer material, such as the TIM, to be used. Thus, the semiconductor device 10 may have excellent heat dissipation characteristics and yet can be produced at a low manufacturing cost. In addition, the plate 400 may be provided separately from the first and second case parts 100 and 200 in the semiconductor device 10, thus making the manufacturing the plate 400 and the first case part 100 and the second case part 200 relatively easy.

A method of manufacturing the semiconductor device 10 described above may include providing the semiconductor module 300, providing the plate 400 overlapping with the semiconductor module 300 and including a material having thermal conductivity on the semiconductor module 300, providing the first and second case parts 100 and 200 coupled to each other to form the inner space 105 in which the semiconductor module 300 and the plate 400 are disposed, and coupling the first case part 100, the semiconductor module 300, the plate 400, and the second case part 200. The providing of the plate 400 may include coupling the plate 400 to the first case part 100 (see FIG. 3). The coupling of the plate 400 to the first case part 100 may include coupling the plate 400 to the first case part 100 by a screw-hole engagement method, a press-in method, and/or a welding method. The coupling of the first case part 100, the semiconductor module 300, the plate 400, and the second case part 200 may be performed by a screw-hole engagement method, a press-in method, and/or a welding method. In the present specification, the first and second case parts 100 and 200 coupled to each other by the screw-hole engagement method are illustrated as an example for the purpose of ease and convenience in illustration. However, the inventive concepts are not limited thereto.

Figure 4A:
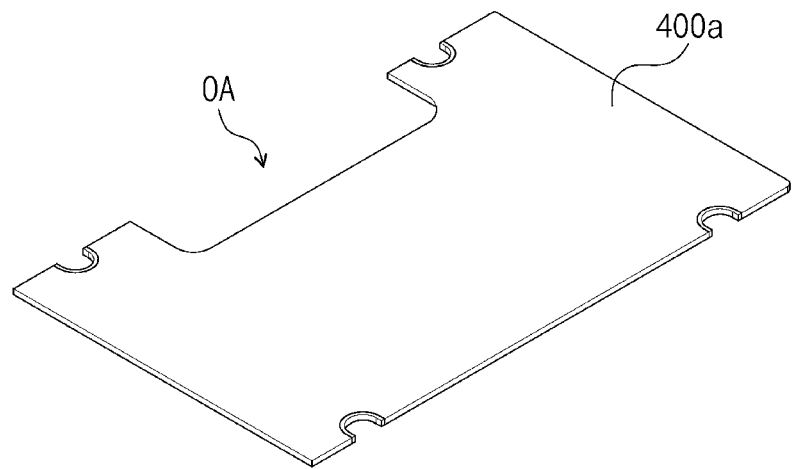
FIG. 4A is a perspective view of a version of a plate constituting a thermal conductor of a semiconductor device according to the inventive concepts.
Figure 4B:
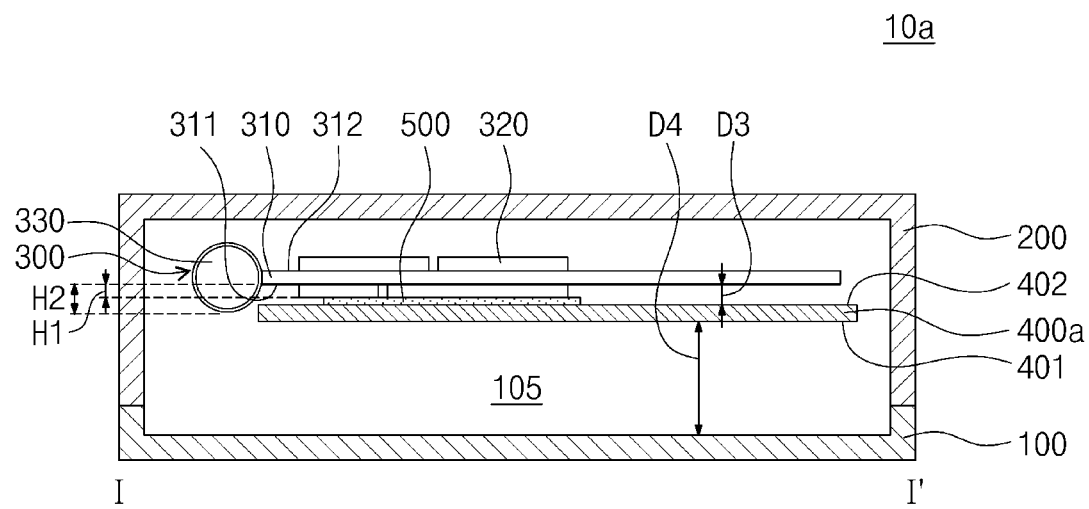
FIG. 4B is a cross-sectional view of the semiconductor device including the plate of FIG. 4A.

Another example of a semiconductor device 10a according to the inventive concepts is shown in FIG. 4A and FIG. 4B.

In this example, the semiconductor device 10a has a plate 400a including an opening region OA. The opening region OA of the plate 400a may define a notch in a side of the plate or opening extending through the plate 400a. The opening region OA may be located at one side of the plate 400a. In the illustrated example, the opening region OA corresponds to the region of the second semiconductor component 330 of the semiconductor module 300. Because the height H2 of the second semiconductor component 330 is greater than the height H1 of the first semiconductor component 320, a portion of the second semiconductor component 330 may be disposed in the notch or opening defined by the opening region OA. Thus, the plate 400a may be disposed relatively close to the semiconductor module 300.

In FIG. 4B, D3 represents the distance D3 between the semiconductor module 300 and the plate 400a and D4 represents the distance D4 between the first case part 100 and the plate 400a. Because the distance D3 is relatively small, a correspondingly small amount of the first heat dissipation member 500 may be used, thus offering savings in the cost of manufacture.

The shape, size and/or position of the notch in the plate 400a, i.e., the form and location of the opening region OA of the plate 400a, may vary from that illustrated in FIG. 4A in dependence on the arrangement and/or interconnection of the first and second semiconductor components 320 and 330 of the semiconductor module 300. In addition, a hole(s) in the plate 400a corresponding to the hole(s) 404 is/are omitted for the purpose of ease and convenience of illustration. However, the plate 400a may be connected to the first case part 100 by any of the same means described above in connection with FIGS. 1A-3.

Figure 5A:
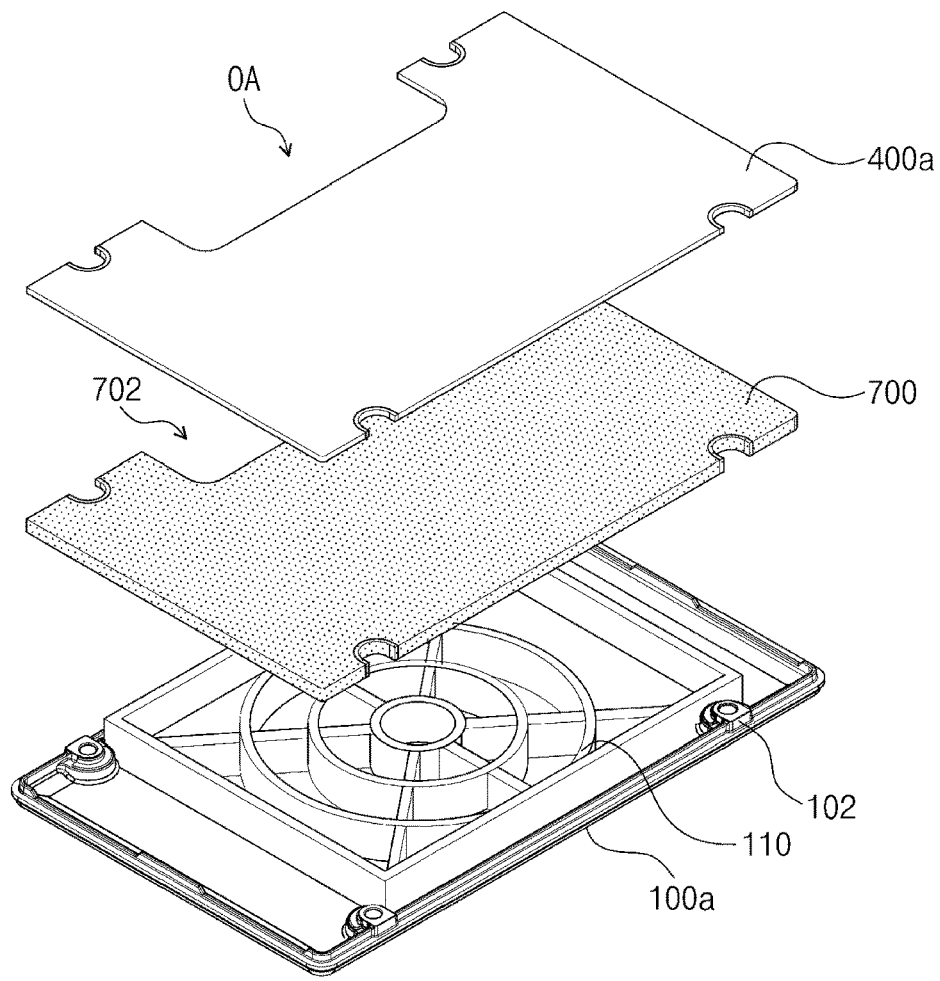
FIG. 5A is a perspective exploded view of parts of another example of a semiconductor device according to the inventive concepts.
Figure 5B:
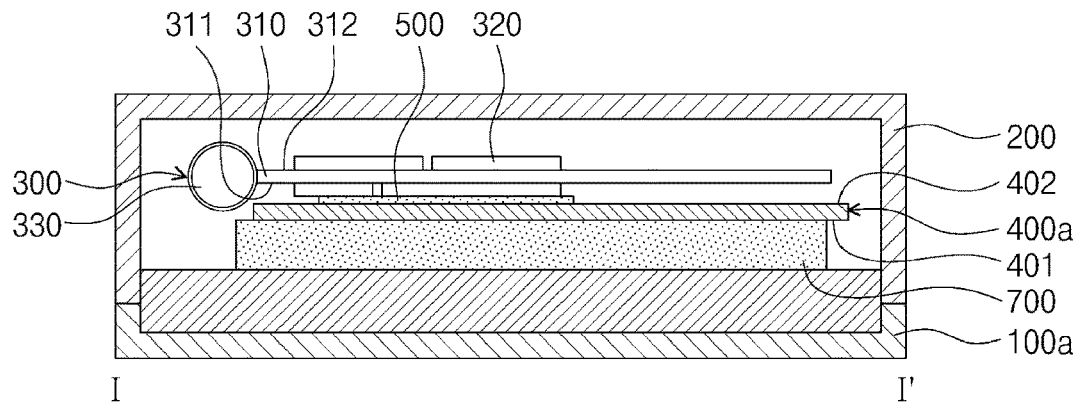
FIG. 5B is a cross-sectional view of the semiconductor device having the parts of FIG. 5A.

FIGS. 5A and 5B is illustrating an example of a semiconductor device 10b according to the inventive concept.

The semiconductor device 10b includes a first case part 100a having a cover part and a rib structure 110. The rib structure 110 may be formed on a bottom surface of the tray of the first case part 100a. The rib structure 110 may have sections that radiate from a central portion thereof. However, the inventive concepts are not limited thereto. A thickness of the rib structure 110 may be equal to or greater than the thickness of the tray of the first case part 100a. In the example shown in FIGS. 5A and 5B, the rib structure 110 projects from the tray of the first case part 100a. However, the inventive concepts are not limited thereto. Furthermore, the rib structure 110 may be formed of the same material as the tray of the first case part 100a. Even though not shown in the drawings, a connector for connecting the rib structure 110 and the plate 400a may be provided.

The semiconductor device 10b may further include a second heat dissipation member 700. The second heat dissipation member 700 may be a piece of thermal tape. However, the inventive concepts are not limited thereto. Alternatively, the second heat dissipation member 700 may comprise TIM.

The second heat dissipation member 700 may be provided between the plate 400a and the first case part 100a. The second heat dissipation member 700 may have the same shape as the plate 400a. In other words, the second heat dissipation member 700 may have a notch 702 corresponding to the notch defined by the opening region OA of the plate 400a. The second heat dissipation member 700 may be in contact with both the plate 400a and the first case part 100a. Alternatively, the second heat dissipation member 700 may be in contact with only one of the plate 400a and the first case part 100a.

According to this example of the inventive concepts, the semiconductor device 10b has excellent structural rigidity owing in part to the rib structure 110 of the first case part 100a. In addition, the semiconductor device 10b has excellent heat dissipating characteristics owing to provision of the second heat dissipation member 700.

Figure 6A:
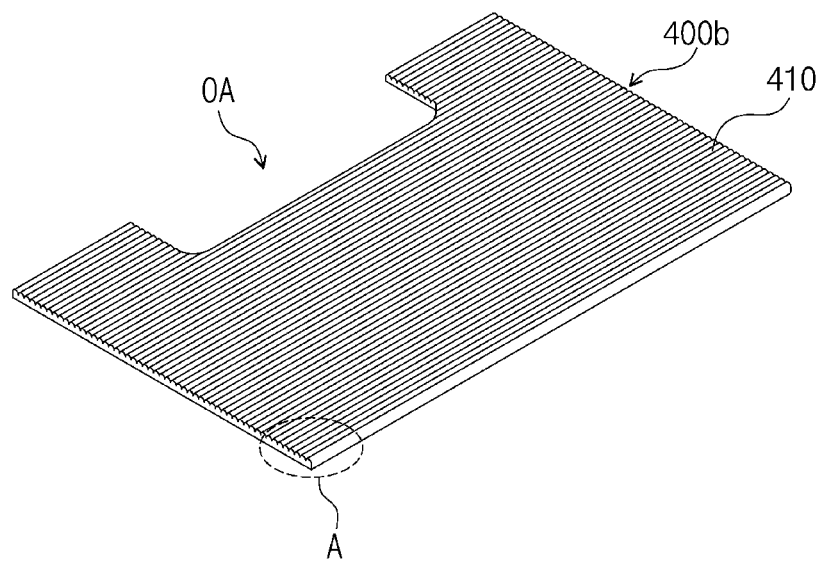
FIG. 6A is a perspective view of another version of a plate constituting a thermal conductor of a semiconductor device according to the inventive concepts.
Figure 6B:
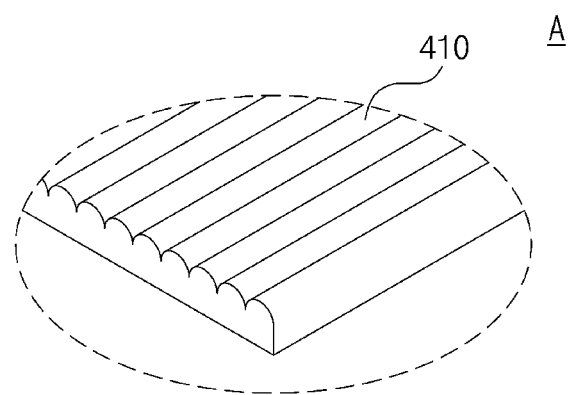
FIG. 6B is an enlarged view of a portion 'A' of the plate of FIG. 6A.

FIGS. 6A and 6B illustrate a plate 400b as an example of the plate that may be employed in a semiconductor device according to the inventive concepts.

Referring to FIGS. 6A and 6B, the plate 400b has grooves 410. The grooves 410 may be defined in at least one surface of the plate 400b. In other words, at least one surface of the plate 400b is undulating. In the illustrated example, the grooves 410 are formed in the second surface 402 (see FIG. 4B) of the plate 400b. A contact area between the first heat dissipation member 500 and the plate 400b is increased by the undulating surface. However, the inventive concepts are not limited to the use of an undulating surface to increase the contact area between the first heat dissipation member 500 and the plate 400b. Rather, the plate may employ various other structures, e.g., protrusions, capable of increasing the contact area between the first heat dissipation member 500 and the plate.

Figure 7A:
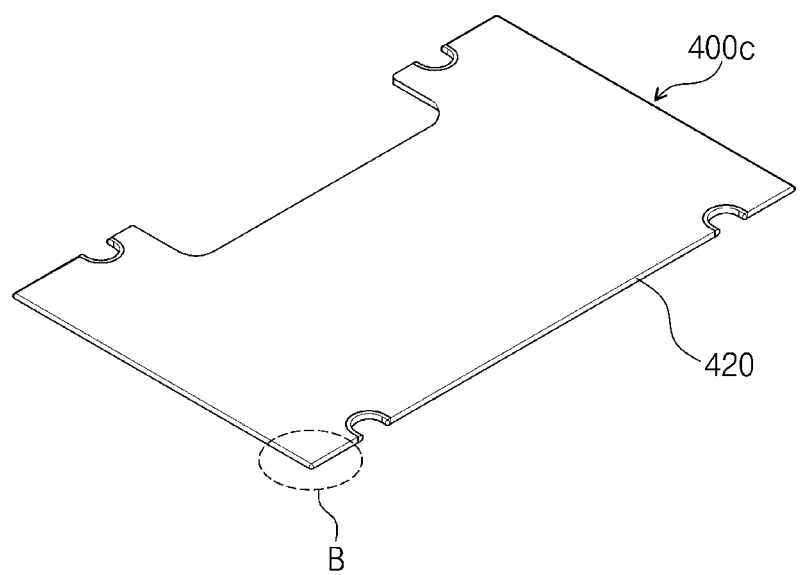
FIG. 7A is a perspective view of still another version of a plate constituting a thermal conductor of a semiconductor device according to the inventive concepts.
Figure 7B:
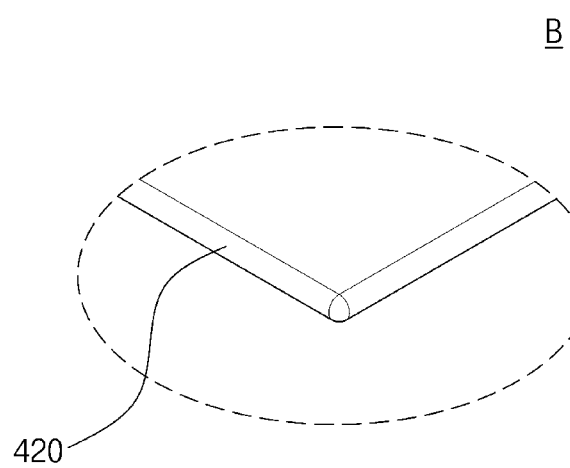
FIG. 7B is an enlarged view of a portion 'B' of the plate of FIG. 7A.

FIGS. 7A and 7B illustrate a plate 400c as another example of the plate that may be employed in a semiconductor device according to the inventive concepts. Referring to FIGS. 7A and 7B, the plate 400c may have a rounded edge 420 between its flat top and bottom surfaces. The rounded edge 420 may be provided along only part of or along the entire edge of the plate 400c.

Figure 8A:
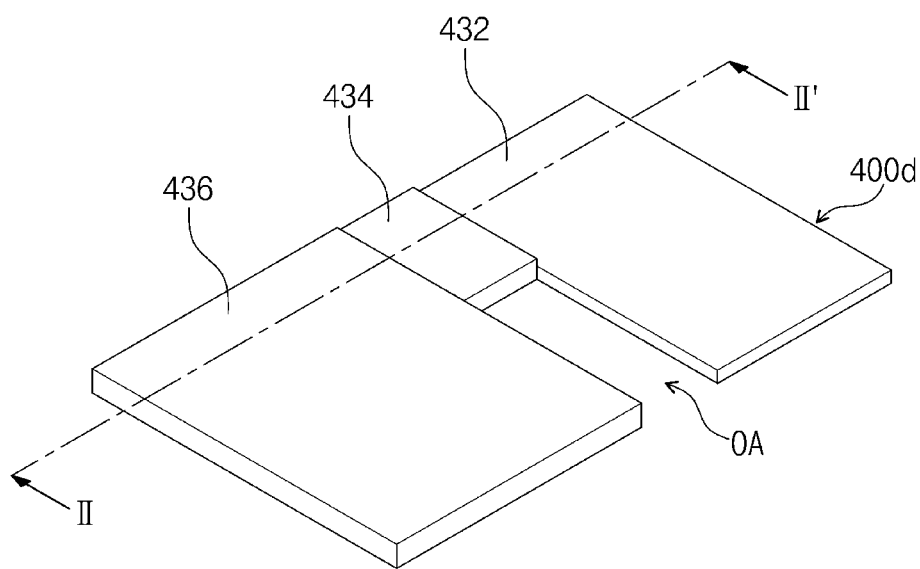
FIG. 8A is a perspective view of still another version of a plate constituting a thermal conductor of a semiconductor device according to the inventive concepts.
Figure 8B:
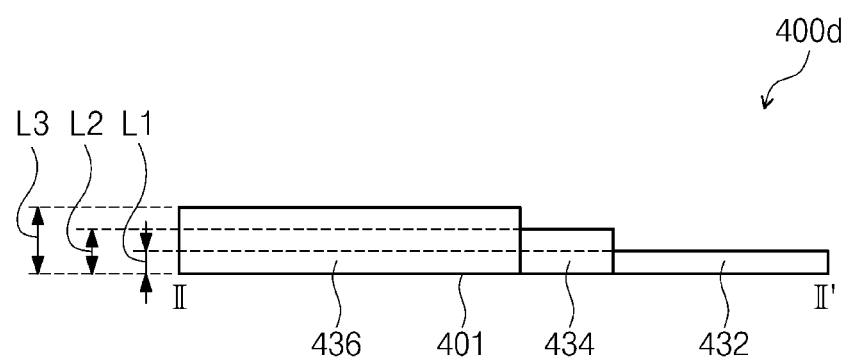
FIG. 8B is a cross-sectional view of the plate taken along a line II-II' of FIG. 8A.

FIGS. 8A and 8B illustrate a plate 400d as another example of a plate that may be employed in a semiconductor device according to the inventive concepts.

Referring to FIGS. 8A and 8B, the plate 400d has a first level portion 432, a second level portion 434, and a third level portion 436. As used herein, the term 'level' refers to thickness or a height with respect to a reference surface. For example, the term 'level' may refer to a height as measured from a first surface 401 of the plate 400d.

The first level portion 432 may have a level L1. The second level portion 434 may have a level L2 different from the level L1. The third level portion 436 may have a level L3 different from the level L1 and the level L2. The level L2 may be higher than the level L1, and the level L3 may be higher than the level L2. In the drawings, the levels are exaggerated for clarity. In other words, the plate 400d has a bottom surface and first, second and third upper surfaces that are disposed at different levels with respect to the bottom surface.

Referring again to FIG. 2B, as was mentioned above, the constituents of the first semiconductor component 320 of the package substrate 310 may have various sizes and shapes, e.g., the chips that make up the first semiconductor component 320 may be of different kinds and have different footprints and/or thicknesses. For example, constituents may include a logic chip (e.g., a controller) and a memory chip and the size (footprint and/or thickness) of the logic chip may be greater than that of the memory chip. Constituents of the first semiconductor component 320, e.g., semiconductor chips, of different heights and mounted on the bottom surface of the package substrate 310 (see FIG. 1B, 4B or 5B) may confront or be at positions to face the first level portion 432, the second level portion 434, the third level portion 436, respectively, such that the constituents are accommodated as close as possible to the plate 400d.

Thus, the plate 400d may accommodate various kinds of constituents of the first semiconductor component 320 mounted on the package substrate 310. For example, the first level portion 432 may be located across from the controller, and the second level portion 434 and the third level portion 436 may be located across from a memory chip. In this case, the volume of first heat dissipation member 500 between the semiconductor module 300 and the plate 400d may be minimized, and thus the cost of manufacture of the semiconductor device may be correspondingly reduced.

Figure 9:
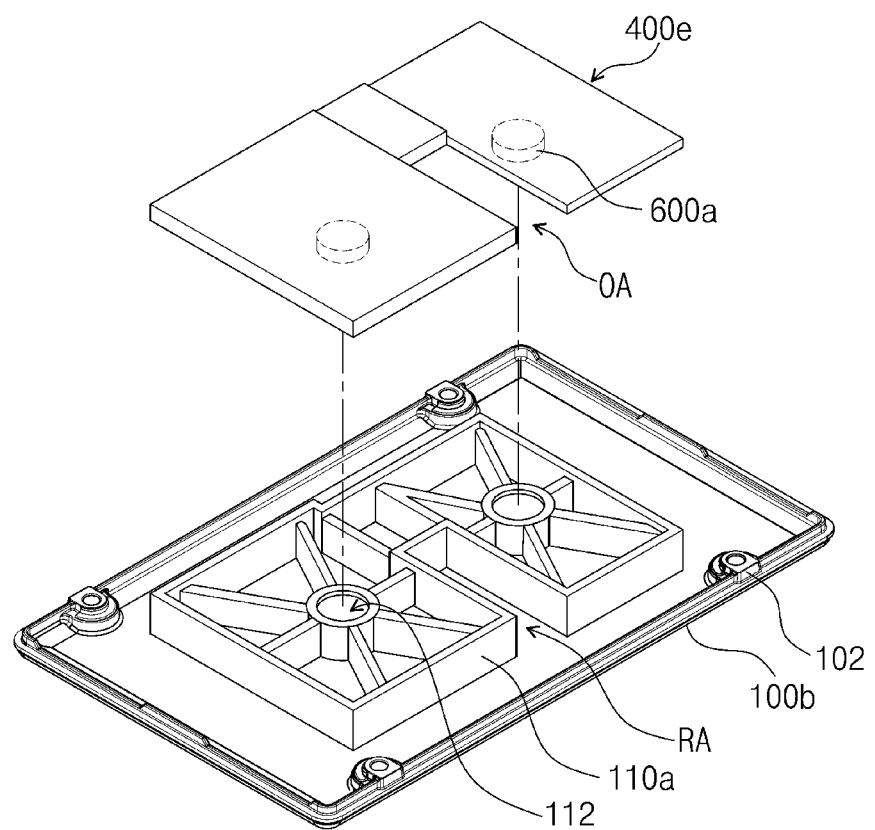
FIG. 9 is an exploded perspective view of a plate and a first case part of a semiconductor device according to the inventive concepts.

FIG. 9 illustrates a plate 400e and a first case part 100b of another example of a semiconductor device according to the inventive concepts.

Referring to FIG. 9, the plate 400e has a form similar to the plate 400d shown in and described with reference to FIGS. 8A and 8B and further includes a connector(s) 600a. In this example, the connector 600a is provided on the first surface 401 (see FIG. 8B) of the plate 400e.

The first case part 100b has a rib structure 110a having a recess region RA defining a recess. The recess defined by the recess region RA of the rib structure 110a may expose a bottom surface of the tray of the first case part 100b. The recess defined by the recess region RA may have a shape corresponding to that of the notch defined by the opening region OA of the plate 400e and may be provided at a position corresponding to the opening region OA. The rib structure 110a may include a hole(s) 112. The connector 600a may be inserted in the hole 112 of the first case part 100b (with an interference fit between the connector 600a and the portion of the first case part 100b defining the hole 112, for example) to couple (by means of a press-fit, for example) the plate 400e and the first case part 100b to each other.

Figure 10:
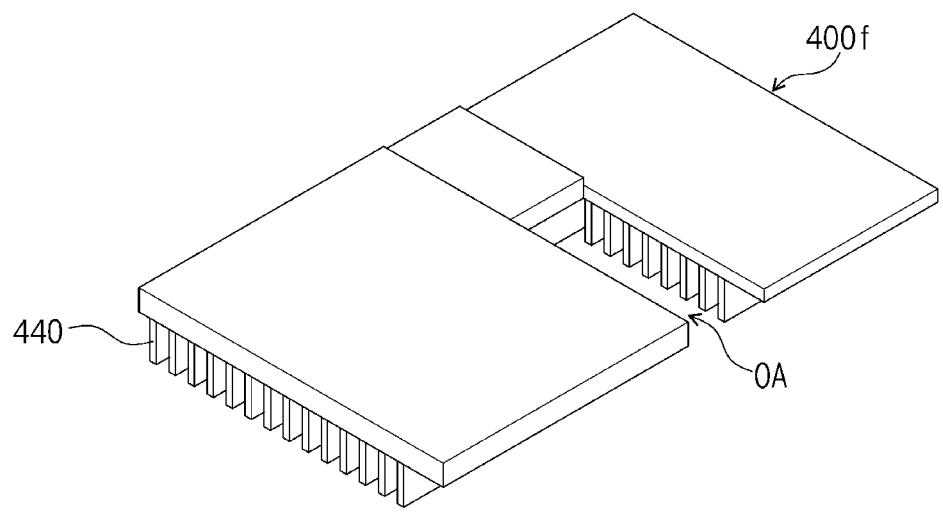
FIG. 10 is a perspective view of another version of a thermal conductor of a semiconductor device according to the inventive concepts.

FIG. 10 illustrates a plate 400f as another example of the plate that may be employed by a semiconductor device according to the inventive concepts.

Referring to FIG. 10, the plate 400f has a fin structure 440 comprising fins protruding from at least one surface of the plate 400f. The fins of the fin structure 440 may extend upright on the first surface 401 of the plate 400f. The fin structure 440 may provide a heat sink. The fin structure 440 (e.g., the heat sink) may absorb heat generated by the semiconductor module 300, and thus a semiconductor device comprising the plate 400f may exhibit excellent heat dissipation characteristics.

Figure 11:
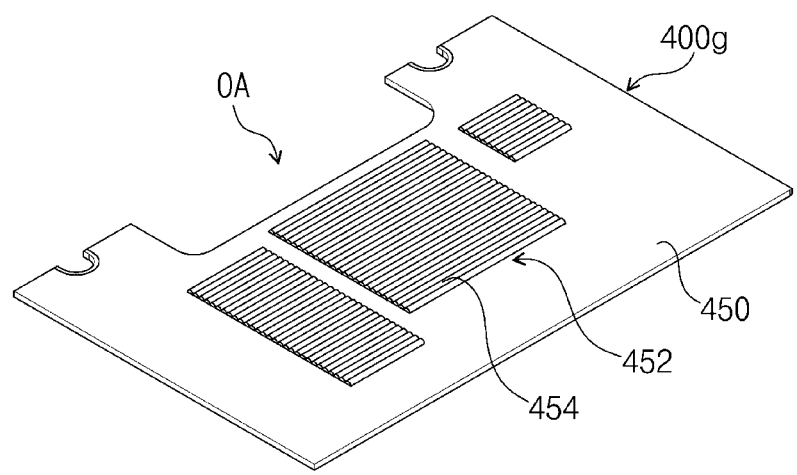
FIG. 11 is a perspective view of still another version a plate constituting a thermal conductor of a semiconductor device according to the inventive concepts.

FIG. 11 illustrates a plate 400g as another example of the plate that may be employed by a semiconductor device according to the inventive concepts.

Referring to FIG. 11, the plate 400g has a first region 450 and a second region 452. The first region 450 may be flat. The second region 452 may have a surface roughness different from that of the first region 450. For example, the second region 452 may include grooves 454. However, the inventive concepts are not limited thereto. That is, the second region 452 may have other forms that provide a surface roughness different from that of the first region 450.

In this example, the contact area of the second region 452 is greater than that of the first region 450. Thus, a semiconductor device including the plate 400g may have excellent local heat dissipation characteristics. For example, the second region 452 may be situated at a position corresponding to the first semiconductor component 320 to effectively transfer heat generated locally by the first semiconductor component 320 and absorbed by the first heat dissipation member 500 (see FIG. 3).

In the examples described above, the first heat dissipation member 500 and/or the second heat dissipation member 700 is/are provided between the semiconductor module 300 and only the first case part 100, 100a or 100b. However, the inventive concepts are not limited thereto. In certain other examples, a heat dissipation member is also provided between the semiconductor module 300 and the second case part 200.

In addition, the rib structure was described as being present inside the first case part 100a or 100b. However, in certain examples, a rib structure may be provided inside the second case part 200.

Furthermore, the above-described examples include plates 400, 400a, 400b, 400c, 400d, 400e, 400f or 400g provided only between the semiconductor module 300 and the first case part 100, 100a or 100b. However, in certain other examples, a plate may be provided between the semiconductor module 300 and the second case part 200. Also, and with this in mind, the "first case part 100" may arbitrarily refer to the bottom or top part of the case, whereas the "second case part 200" may arbitrarily refer to the top or bottom part of the case.

Regardless, according to the an aspect of the inventive concepts, a semiconductor device having excellent heat dissipation characteristics and which can be manufactured at a relatively low cost may be provided.

Finally, examples of the inventive concept have been described above in detail. The inventive concept may, however, be put into practice in many different ways as will be apparent to those of ordinary skill in the art and thus, should not be construed as being limited to the examples described above. Rather, these examples were described so that this disclosure is thorough and complete, and fully conveys the inventive concept to those skilled in the art. Thus, the true spirit and scope of the inventive concept is not limited by the examples described above but by the following claims.

What is claimed is:

1. A solid state drive (SSD) comprising:
a case including a first portion and a second portion coupled to the first portion;
a semiconductor module disposed within the case; and
a thermal conductor disposed within the case, and disposed between the semiconductor module and the first portion of the case,
wherein an inner surface of the first portion of the case is uneven, and the thermal conductor is made of metal.

2. The SSD of claim 1, wherein the inner surface of the first portion of the case includes a recess.

3. The SSD of claim 2, wherein the thermal conductor includes a notch defining an open region, and the inner surface of the first portion of the case is coupled to the thermal conductor with the recess at a position corresponding to a position of the notch.

4. The SSD of claim 1, wherein the inner surface of the first portion of the case includes a rib structure having sections that extend outward from a central region of the rib structure.

5. The SSD of claim 1, wherein a distance between a first part of the thermal conductor and the inner surface of the first portion of the case is different from a distance between a second part of the thermal conductor and the inner surface of the first portion of the case.

6. The SSD of claim 1, wherein a thickness of a first part of the inner surface of the first portion of the case is different from a thickness of a second part of the inner surface of the first portion of the case.

7. The SSD of claim 1, wherein the thermal conductor is thermally coupled to the first portion of the case.

8. The SSD of claim 1, wherein the thermal conductor contacts the semiconductor module.

9. The SSD of claim 1, wherein the first portion of the case is made of a metal.

10. The SSD of claim 1, wherein the thermal conductor is configured to transfer heat generated from the semiconductor module to the first portion of the case.

11. The SSD of claim 1, further comprising a first heat dissipation member disposed on the inner surface of the first portion of the case.

12. The SSD of claim 11, further comprising a second heat dissipation member contacting the semiconductor module.

13. The SSD of claim 12, wherein the second heat dissipation member is square-shaped.

14. The SSD of claim 12, wherein the first heat dissipation member is rectangle-shaped including a notch and apertures along edges of the first heat dissipation member.

15. The SSD of claim 1, wherein the first portion of the case is configured to transfer heat generated from the semiconductor module.

16. A solid state drive (SSD) comprising:
a case including a first portion and a second portion coupled to the first portion;
a semiconductor module disposed within the case;
a thermal conductor disposed within the case, and disposed between the semiconductor module and the first portion of the case;
a first heat dissipation member disposed on an inner surface of the first portion of the case;
a second heat dissipation member in contact with the thermal conductor,
wherein an inner surface of the first portion of the case is uneven, and
a thickness of a first part of the inner surface of the first portion of the case is different from a thickness of a second part of the inner surface of the first portion of the case.

17. The SSD of claim 16, wherein the first heat dissipation member is rectangle-shaped including a notch and apertures along edges of the first heat dissipation member, and the second heat dissipation member is square-shaped.

18. The SSD of claim 16, wherein the second heat dissipation member contacts the semiconductor module.

19. A solid state drive (SSD) comprising:
a case including a first portion and a second portion coupled to the first portion;
a semiconductor module disposed within the case;
a thermal conductor disposed within the case, and disposed between the semiconductor module and the first portion of the case;
a first heat dissipation member disposed on an inner surface of the first portion of the case; and
a second heat dissipation member in contact with the semiconductor module and the thermal conductor,
wherein an inner surface of the first portion of the case is uneven,
a thickness of a first part of the inner surface of the first portion of the case is different from a thickness of a second part of the inner surface of the first portion of the case,
the second heat dissipation member is square-shaped, and
the thermal conductor is thermally coupled to the first portion of the case.

* * * * *